(12) United States Patent
Pollock et al.

(10) Patent No.: US 10,394,230 B2
(45) Date of Patent: Aug. 27, 2019

(54) METHODS AND SYSTEMS FOR INVERTING A SIMULATION PROCESS TO VALIDATE A PRODUCT DESIGN

(71) Applicant: Dassault Systemes Simulia Corp., Johnston, RI (US)

(72) Inventors: Gerry Pollock, Cranston, RI (US); Jonathan Paul Wiening, Cranston, RI (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 239 days.

(21) Appl. No.: 15/386,370

(22) Filed: Dec. 21, 2016

(65) Prior Publication Data
US 2018/0173206 A1   Jun. 21, 2018

(51) Int. Cl.
G05B 17/00 (2006.01)
G05B 19/418 (2006.01)
G06F 17/50 (2006.01)

(52) U.S. Cl.
CPC ..... G05B 19/4188 (2013.01); G06F 17/5009 (2013.01); G05B 2219/33286 (2013.01); G06F 2217/14 (2013.01); Y02P 90/265 (2015.11)

(58) Field of Classification Search
None
See application file for complete search history.

(56) References Cited

U.S. PATENT DOCUMENTS

| | | | | |
|---|---|---|---|---|
| 6,370,494 B1* | 4/2002 | Mizuno | ............... | G06F 17/5022 703/17 |
| 8,726,203 B1* | 5/2014 | Uckun | ........... | G01R 31/318371 700/1 |
| 2003/0158676 A1 | 8/2003 | Fields et al. | | |
| 2010/0042380 A1* | 2/2010 | Suh | ........................ | G06F 17/50 703/1 |

OTHER PUBLICATIONS

ANSYS Mechanical APDL Structural Analysis Guide; Release 15.0; Nov. 2013,; Canonsburg, PA; 100 pp.
Morkevicius, Aurelijus et al.; An Approach: SysML-based Automated Requirements Verification; 2015 IEEE International Symposium on Systems Engineering; Sep. 28-30, 2015; Rome, Italy; 6 pp.
EPO Extended Search Report for related application 17209181.1 dated Apr. 18, 1018; 16 pp.

* cited by examiner

Primary Examiner — Paul B Yanchus, III
(74) Attorney, Agent, or Firm — Armstrong Teasdale LLP

(57) ABSTRACT

Embodiments of the present invention relieve the burden on a product designer to setup simulations to validate a product design. These embodiments are directed to computer methods and systems for inverting a simulation process to validate a product design. The methods and systems configure a simulator with analysis methods. The methods and systems then provide product design parameters (operating environment conditions and design targets) that define scenarios likely experienced by a product in terms familiar to the product designer. The methods and systems, via the simulator, automatically determine simulations for validating the product design based on the provided product design parameters. To do so, the methods and systems map each of the design parameters to one or more analysis types, which are used by the simulator to select a sequence of analysis methods to define the simulations. The methods and systems execute the simulations to validate the product design.

24 Claims, 9 Drawing Sheets

REQUIRED ANALYSIS TYPES

| OPERATING ENVIRONMENT CONDITION (220) | ASSOCIATED ANALYSIS TYPE (260) |
|---|---|
| HAND PUSH TOP | STRUCTURAL |
| HAND PUSH SIDE | STRUCTURAL |
| CLAMP | STRUCTURAL |

| DESIGN TARGET (230) | ASSOCIATED ANALYSIS TYPE (260) |
|---|---|
| FACTOR OF SAFETY | STRUCTURAL STATIC |
| FATIGUE LIFE | STRUCTURAL DURABILITY |
| VIBRATION FREQUENCY | FREQUENCY |

FIG. 2B

SIMPLE EXAMPLE RESULTS

| DESIGN TARGET | TARGET VALUE | SCENARIO 1 | SCENARIO 2 |
|---|---|---|---|
| FACTOR OF SAFETY | >2.0 | 1.5 | 3.2 |
| FATIGUE LIFE | >20,000 CYCLES | 8,900 CYCLES | 22,600 CYCLES |
| VIBRATION FREQUENCY | >100Hz | 153Hz | 47Hz |

230 232 240 245

USER DEFINED TARGET VALUES

RESULTS FROM SIMULATION
236

FIG. 2D

MORE COMPLICATED EXAMPLE / USER INPUT

| 320 OPERATING ENVIRONMENT CONDITION | 322 VALUE | 340 SCENARIO 1 | 345 SCENARIO 2 |
|---|---|---|---|
| HAND PUSH TOP | 0.50 Pa | ✓ | |
| HAND PUSH SIDE | 0.25 Pa | | ✓ |
| CLAMP BOTTOM | | ✓ | |
| AIRFLOW AROUND PRODUCT | 5 m/s | ✓ | |
| INITIAL TEMPERATURE | 70 deg F | ✓ | |
| HEAT RADIATION | 20 W | | ✓ |
| ELECTRICAL HEAT SOURCE | 35 W | | ✓ |
| WATER FLOW AROUND PRODUCT | 20 m/s | | ✓ |

| 330 DESIGN TARGET | 332 TARGET VALUE | 340 SCENARIO 1 | 345 SCENARIO 2 |
|---|---|---|---|
| FATIGUE LIFE | >20,000 CYCLES | ✓ | ✓ |
| VIBRATION FREQUENCY | >100Hz | ✓ | ✓ |
| MAXIMUM TEMPERATURE AFTER 3 s | <120 deg F | ✓ | ✓ |
| MAXIMUM "LONG-TIME" TEMPERATURE | <85 deg F | ✓ | ✓ |
| MAXIMUM AIR PRESSURE DROP | <1.2 Pa | ✓ | ✓ |
| MAXIMUM TURBULENT KINETIC ENERGY | <20 Watt-sec | ✓ | ✓ |
| MAXIMUM STRESS | <2.5e6 N/m^2 | ✓ | ✓ |
| BUCKLING LOAD | >1000N | ✓ | ✓ |
| FACTOR OF SAFETY | >2.0 | ✓ | ✓ |

USER DEFINED TARGET VALUES

FIG. 3A

REQUIRED ANALYSIS TYPES

| OPERATING ENVIRONMENT CONDITION 320 | ASSOCIATED ANALYSIS TYPE 360 |
|---|---|
| HAND PUSH TOP | STRUCTURAL |
| HAND PUSH SIDE | STRUCTURAL |
| CLAMP BOTTOM | STRUCTURAL |
| AIRFLOW AROUND PRODUCT | CFD EXTERNAL FLOW |
| INITIAL TEMPERATURE | HEAT TRANSFER |
| HEAT RADIATION | HEAT TRANSFER |
| ELECTRICAL HEAT SOURCE | HEAT TRANSFER |
| WATER FLOW AROUND PRODUCT | CFD EXTERNAL FLOW |

| DESIGN TARGET 330 | ASSOCIATED ANALYSIS TYPE 360 |
|---|---|
| FATIGUE LIFE | STRUCTURAL DURABILITY |
| VIBRATION FREQUENCY | FREQUENCY |
| MAXIMUM TEMPERATURE AFTER 3 s | TRANSIENT HEAT TRANSFER |
| MAXIMUM "LONG-TIME" TEMPERATURE | STEADY-STATE HEAT TRANSFER |
| MAXIMUM AIR PRESSURE DROP | CFD |
| MAXIMUM TURBULENT KINETIC ENERGY | CFD |
| MAXIMUM STRESS | STRUCTURAL STATIC |
| BUCKLING LOAD | STRUCTURAL BUCKLING |
| FACTOR OF SAFETY | STRUCTURAL STATIC |

FIG. 3B

METHODS AND SYSTEMS FOR INVERTING A SIMULATION PROCESS TO VALIDATE A PRODUCT DESIGN

BACKGROUND

To assess the validity of a product design, a designer typically must run simulations. To do so, current software solutions require the designer to set up the simulations by selecting an analysis type, selecting analysis methods and features to define each simulation, and specifying an analysis sequence to run the defined simulations. However, designers often are not familiar with simulation-specific terminology, concepts, and processes, and, therefore do not have knowledge of the various analysis types, the technical details of the analysis methods and features, or the appropriate analysis sequence to run the simulations. Thus, the designer may not set up the most effective or comprehensive simulations for generating simulation results to validate the product design. Further, once the simulations are run, the designer must perform the inefficient task of manually reviewing the simulation results against design targets to assess the validity of the design.

SUMMARY OF THE INVENTION

The present invention provides an improved simulation approach that relieves the burden on a user (product developer) to set up simulations to validate a product design. The improved solution enables the user to instead specify the objectives of the product design in product design terms familiar to the user, such as operating environment conditions and design targets, which the solution uses to automatically define and run simulations to generate simulation results. The solution further automatically analyzes the simulation results against the design targets to assess the validity of the product design and provide the user guidance toward tuning, or otherwise improving, the product design. The described embodiments shift a user's responsibilities from those focused on the simulation (i.e., selecting analysis types, methods, and features, specifying analysis sequence, etc.) to those related to objectives in terms of the product under consideration. This shifting is referred to herein as "inverting" a simulation process.

Embodiments of the present invention are directed to computer-implemented methods and computer systems for inverting a simulation process. The computer systems comprise a processor and a memory with computer code instructions stored thereon. The memory is operatively coupled to the processor such that, when executed by the processor, the computer code instructions cause the computer system to implement a simulator module, a user interface, and a computer application. In these embodiments, the methods and systems configure the simulator (or simulator module) with one or more simulation analysis methods. In some embodiments, the simulation analysis methods include analysis sequences defined based on the one or more analysis types. In example embodiments, the simulation analysis methods are configured at the simulator by one or more method developers.

The methods and systems then provide product design parameters (via a user interface) to the simulator (or simulator module). The product design parameters may include at least one of operating environment conditions and design targets for the product design. The methods and systems (via a computer application) automatically define, by the simulator (or simulator module), at least one simulation for validating the product design by selecting one or more of the simulation analysis methods based on the product design parameters. In some embodiments, the methods and systems automatically define the at least one simulation by mapping each of the product design parameters to one or more analysis types. In these embodiments, the methods and systems further determine, via the simulator (or simulator module), a sequence of the one or more simulation analysis methods to execute. In some embodiments, the one or more analysis types may include at least one of: structural, structural static, structural durability, structural buckling, heat transfer, transient heat transfer, steady-state heat transfer, computational fluid dynamics (CFD), CFD external flow, and frequency. The methods and systems then execute the at least one defined simulation to validate the product design.

Further embodiments of the present invention are directed to other computer-implemented methods and computer systems for inverting a simulation process to validate a product design. The computer systems comprise a processor and a memory with computer code instructions stored thereon and executed by the processor. In these embodiments, the methods and systems, for the purpose of designing a product, define scenarios likely experienced by the product, along with design targets. Each of the defined scenarios includes a set of operating environment conditions. A user interface may be configured to enable a user to define the scenarios and define targets. In some example embodiments, the operating environment conditions include at least one of: loads, restraints, temperatures, and fluid velocities, although other operating environment conditions known in the art may be used in other embodiments. In some example embodiments, the design targets include at least one of: minimum factor of safety, maximum displacement, fatigue life, minimum lowest frequency, other industry specifications, and other industry standards, although other design targets known in the art may be used in other embodiments.

For each given scenario, the methods and systems map each of the set of operating environment conditions to an analysis type that is added to a list of analysis types associated with the product. For each design target of the set of design targets, the methods and systems also map the design target to an analysis type that is added to the list of analysis types associated with the product. In some example embodiments, the analysis types include one or more of: structural, structural static, structural durability, structural buckling, heat transfer, transient heat transfer, steady-state heat transfer, computational fluid dynamics (CFD), CFD external flow, and frequency, although other analysis types known in the art may be used in other embodiments. In example embodiments, each operating environment conditions and each design target is mapped to at least one analysis type in computer memory. The methods and systems next generate one or more simulations by determining an analysis sequence from the list of analysis types. In some example embodiments, the analysis sequence is determined by a simulator module configured by one or more method developers. The methods and systems then execute the one or more simulations based on the determined analysis sequence to validate the product design.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a flowchart of an example computer method and/or system for inverting a simulation process to validate a product design in embodiments of the present invention.

FIGS. 2A-2D illustrate an example of the automated defining and executing of simulations in embodiments of the present invention.

FIGS. 3A-3B illustrate another example of the automated defining of simulations in embodiments of the present invention.

DETAILED DESCRIPTION OF THE INVENTION

A description of example embodiments of the invention follows.

The described embodiments invert a simulation process to validate a product design. These embodiments enable a user, such as a product designer, to validate a product design without needing to understand simulation concepts, terminology, and processes. In particular, these embodiments enable the user to provide input based solely in product design terms familiar and appropriate to the user. For example, the user may provide input by defining scenarios likely experienced by the designed product. The product scenarios may be defined in terms of operating environment conditions and other product design terms familiar to the user. The user may also provide product design input that indicates design targets for assessing the product design.

Based on the product design input provided by the user, these embodiments automatically define and run simulations, and assess the resulting simulation data, to validate the product design. In this way, the user may validate the product design without needing to provide simulation definitions (analysis types, analysis methods/features, analysis sequences, and such) unfamiliar to the user or manually analyze simulation results. Thus, the user may focus on the problem statement and objectives (end goals) of determining whether a particular product design is a valid design candidate for further tuning and comparing to other product designs. Rather than focusing on the details of how to define and run useful simulations to generate necessary simulation results, and how to analyze the generated simulation results, the user can concentrate on aspects of the product design. These embodiments may also provide guidance (inputs) for tuning, or otherwise improving, a validated product design candidate.

Method of Inverting a Simulation Process

Figure 1:
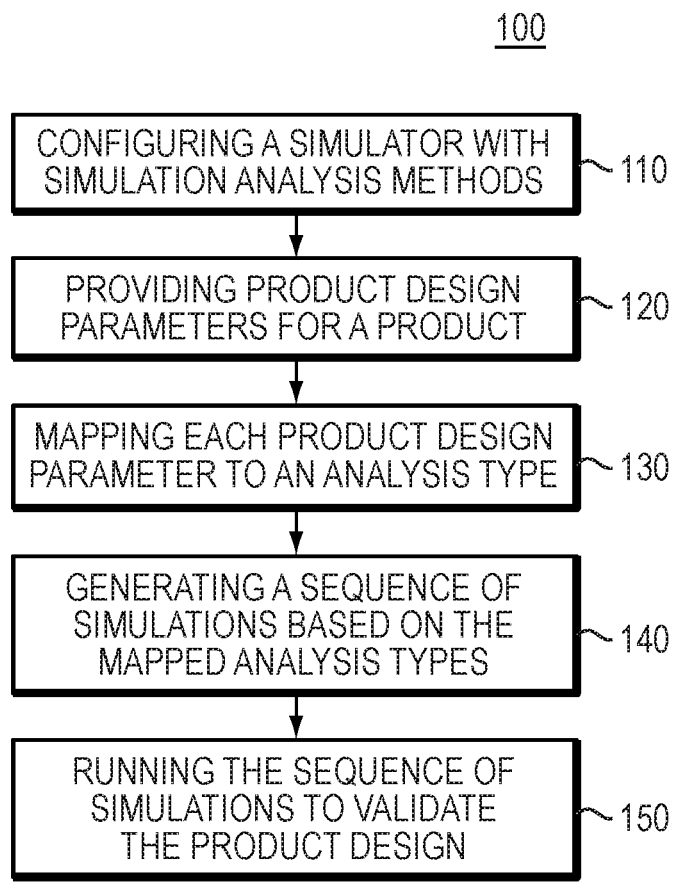

FIG. 1 illustrates a computer method and/or software assembly 100 that implements a procedure for inverting the simulation process according to the described embodiments. The step or module 110 (of generally method/assembly 100) configures a simulator with one or more simulation analysis methods. The procedure may configure the simulator as a "black box," such that the structure or implementation of the simulation analysis methods is not known, or does not need to be known, to a user (e.g., product designer). The simulation analysis methods may be program code, or any other form of computer instructions or rules, which may be generated by a computer or provided by a method developer for automatically defining simulations. The simulation analysis methods may enable automatically defining simulations, including analysis features and analysis sequences of the simulations, based on simulation analysis types. Example simulation analysis methods configured at a simulator (black box) to automatically define simulations are shown in Example 1 as follows.

EXAMPLE 1

```
if ( analysis set contains "static" + "heat transfer" ) then
    sequence = sequential heat transfer → thermal stress
else if ( analysis set contains "frequency" + "static") then
    sequence = static preload step → frequency step
else if ( analysis set contains "fatigue analysis" + "static analysis" ) then
    sequence = sequential static analysis → fatigue analysis
else if ( ... ) then
    ...
end if
```

In Example 1, simulation analysis methods are configured at the simulator (black box) for selection based on simulation analysis types. The function "analysis set contains" is configured to process one or more simulation analysis types, such as "static"+"heat transfer." This function determines if a corresponding simulation analysis method, such as "heat transfer→thermal stress," applies for defining a simulation to validate a given product design. If the corresponding simulation analysis method does apply, the function "sequential" is configured to process the simulation analysis method and return the sequence (placed in the "sequence" variable) of executing the simulation defined by that simulation analysis method.

After configuration of the simulator, the step or module 120 provides design parameters for a product. In some embodiments, a user may input the product design parameters, and associated values, through a user interface, such as a two-dimensional or three-dimensional graphical user interface, command-line interface, or the like. In other embodiments, the product design parameters, and associated values, may be automatically generated by a computer or other automated device or application. The provided product design parameters may define scenarios likely experienced by the product that indicate the desired effects of the product design. The product design parameters may include design targets for the product, operating environment conditions for the product, and any other parameters related to the design of the product.

In some embodiments, the step or module 120 may also provide a target value associated with each design target parameter, which may be used as part of the criteria for validating the product design. The associated target value may indicate certain bounds on the parameter that must be met for the product design to be validated. For example, the step or module 120 may provide the factor of safety parameter as a design target and provide an associated target of greater than 2 that must be met for validation. In this example, the factor of safety is a measure of the yield stress of the product's material relative to the maximum stress developed in the product under the environmental conditions (a factor of safety of 2 means that the maximum stress is half as much as would cause the product to yield or begin failing). The designer must ensure that the factor of safety (larger is safer) is above a target value that may be required based on company or customer specifications or industry standards. In some embodiments, the step or module 120 may also provide a value associated with some or all of the operating environment condition parameters, which may also be used as part of the criteria for validating the product design. An associated value may indicate the particular state of the parameter in the scenario to be used in validating the product design. For example, the step or module 120 may provide the heat radiation operating environmental condition as part of a defined scenario and provide the associated value (state) of the heat radiation in the scenario as 20 watts. In this case, by providing the heat radiation, the designer is specifying the amount of heat that will be exchanged between a particular surface of the product and its surroundings through radiation.

In response to the provided product design parameters, the step or module 130 maps (by a computer application) each of the product design parameters to a simulation analysis type implied by the respective product design parameter. For example, the product design parameter (design target) factor of safety may be mapped to the implied simulation analysis type of structural static. For another example, the product design parameter (operating environment condition) heat radiation may be mapped to the implied simulation analysis type of heat transfer. In some embodiments, each of various product design parameters are configured in memory (e.g., in a database) mapped to a respective implied simulation analysis type, and, in other embodiments, the implied simulation analysis types are determined dynamically by the computer application based on the product design parameters. Thus, the user attempting to validate a product design does not need to explicitly determine and select the types of simulations required to validate the design. Rather, the user only needs to define product scenarios and design targets that indicate the desired effects of the product design.

At step or module 140, the method/assembly 100 next generates a sequence of simulations based on the mapped analysis types. In some embodiments, the step or module 140 organizes the analysis types into a data structure, such as a list, and transmits the data structure to the simulator (black box). For the analysis types in the received structure, the simulator selects one or more simulation analysis methods from the simulation analysis methods configured at the simulator in step or module 110. For example, as shown in Example 1, if the received analysis types include "static" and "heat transfer", the simulator may select the simulation analysis method "heat transfer→thermal stress". The one or more selected simulation analysis methods define the analysis features and details for generating data results to analyze the product design. The simulator also determines an order of the selected one or more simulation analysis methods, for example, by calling the "sequential" function in Example 1. The simulator then generates simulations that execute the selected simulation analysis methods in their determined order.

At step or module 150, the method/assembly 100 then runs the sequence of simulations to validate the product design. The step or module 150 executes the sequence of simulations to generate data results, and analyzes the data results, to provide an indication (e.g., pass or fail) of validation of the product design to the user. The analysis of the data results may include comparing the data results to the target values associated with the indicated design targets, as provided in step or module 120. The step or module 150 may also provide guidance (inputs) for tuning, or other improvements, to a validated (e.g., indicated passed) product design candidate.

Example of Generating Simulations for Validation

Figure 2A:
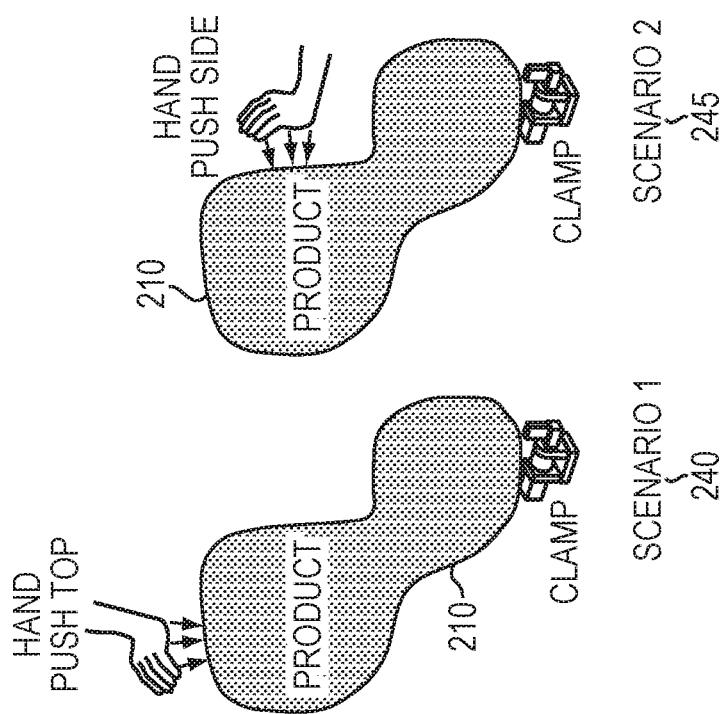
Figure 2C:
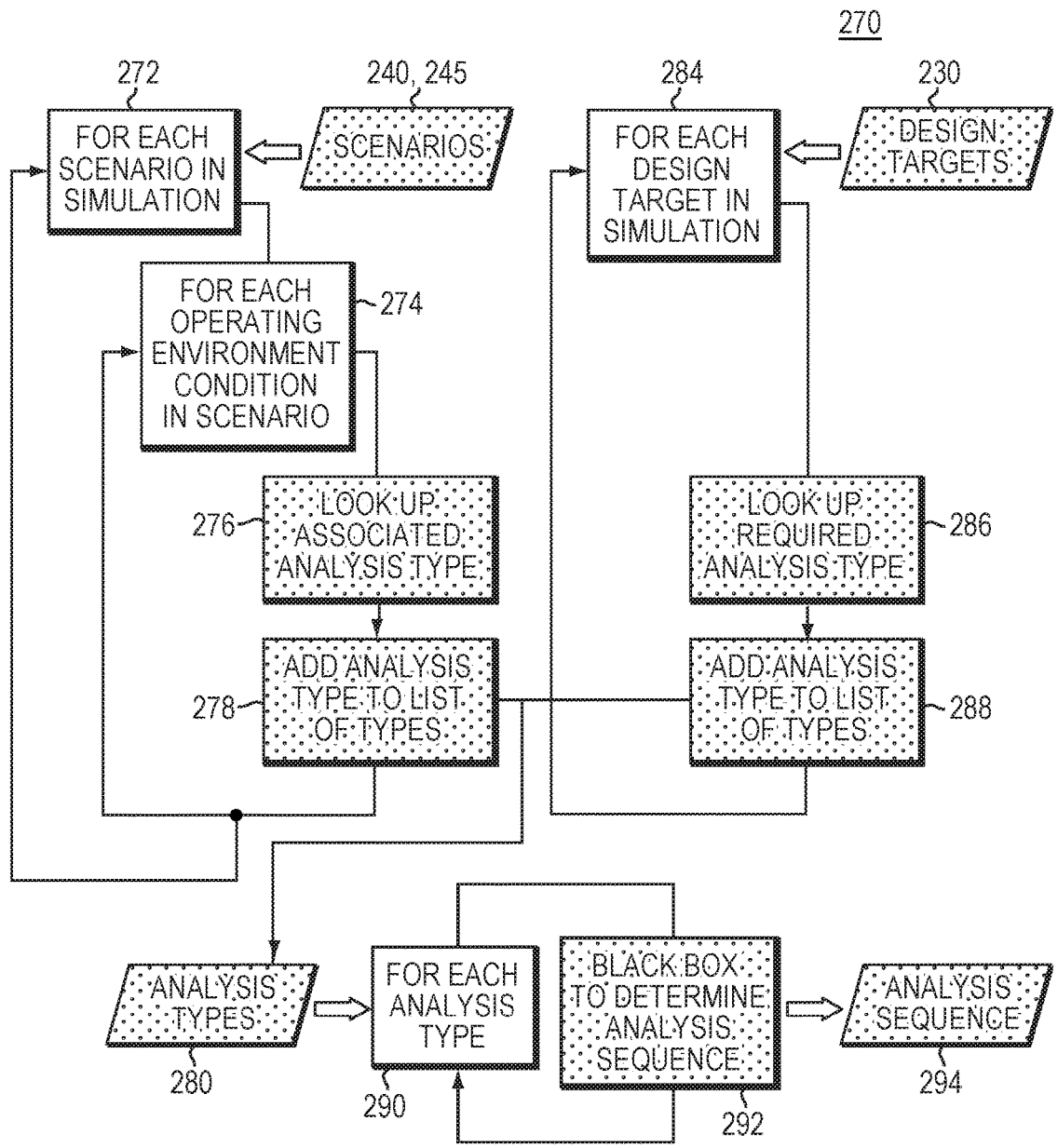

FIGS. 2A-2C illustrates an example of generating simulations for the validating of a product design in embodiments of the present invention. FIG. 2A illustrates the providing of input by a user (e.g., product designer) for the purpose of designing a product 210. The user provides the input by defining scenarios likely experienced by the product 210 that indicate the desired effects of the product design. In particular, the user defines the scenarios in the product design terms of operating environment conditions 220. The operating environment conditions 220 for the product 210 may include loads, restraints, temperatures, fluid velocities, and such. For each of the provided operating environment conditions 220, the user may also provides an associated value 222 that indicates the desired state or effect of the operating environment condition in the defined scenario of the product design.

Further, design targets 230 that the product must satisfy (in designer-friendly terms) are also provided to further indicate the desired effects of the product design. The design targets 230 for the product 210 may include: minimum factor of safety, maximum displacement, fatigue life, minimum lowest frequency, and various other industry specifications and standards. For each of the design targets 230, the user may also provide a target value 232 that indicates the certain bounds that the design must satisfy to be considered a valid candidate for further tuning or comparison to other designs (validation of product design).

In FIG. 2A, the user defines Scenario 1 240, as a scenario likely experienced by the product 210 that indicates the desired effects of the product design. To define Scenario 1 240, the user provides two operating environment conditions 220 of the product 210: hand push top and clamp. For the hand push top, the user also provides an associated value 222 that indicates the desired effect of the hand push to the top of the product in the defined scenario is a pressure of 0.50 Pascals (PA). In FIG. 2A, the user further defines Scenario 2 245, as a scenario likely experienced by the product 210 that indicates the desired effects experienced by the product design (i.e., the product 210). To define Scenario 2 245, the user provides two operating environment conditions 220 of the product 210: hand push side and clamp. For the hand push side, the user also provides an associated value 222 that indicates the desired effect of the hand push to the side of the product in the defined scenario is a pressure of 0.25 PA experienced by the product.

In FIG. 2A, the user also specifies that for both scenarios 240, 245, the product design must satisfy the design targets 230: factor of safety, fatigue life, and vibration frequency to further indicate the desired effects of the product design. For the design target factor of safety, the user provides an associated target value 232 that indicates the bounds on the factor of safety for the product 210 is greater than 2.0 for validation. For the design target fatigue life, the user provides an associated target value 232 that indicates the bounds on the fatigue life for the product 210 is greater than 20,000 cycles for validation. For the design target vibration frequency, the user provides an associated target value 232 that indicates the bounds on the vibration frequency for the product 210 is greater than 100 Hertz (Hz) for validation.

FIG. 2B illustrates the mapping (by a computer application) of the defined scenarios of FIG. 2A to simulation analysis types 260 implied from the scenarios. Each operating environment condition 220 and design target 230 implies a simulation analysis type 260. For example, the operating environment condition 220 of hand push top implies structural analysis and the design target 230 of fatigue life implies structural durability analysis. In FIG. 2B, the computing application maps each specified operating environment conditions 220 and design target 230 to their implied simulation analysis type. In particular, in FIG. 2B, the computer application maps each operating environment conditions 220 of hand push top, hand push side, and clamp to the associated analysis type of structural. The computer application further maps the design target factor of safety to the associated analysis type of structural static, the design target fatigue life to the associated analysis type of structural durability, and the design target vibration frequency to the associated analysis type of frequency.

In some embodiments, the operating environment conditions 220 and design targets 230 are configured in memory (e.g., in a database) mapped to the associated implied analysis types 260 for access by the computer application. In other embodiments, the computer application dynamically determines the implied simulation analysis types 260 based on the specified operating environment conditions 220 and design targets 230. Thus, a user (e.g. product designer) attempting to validate a product design, does not need to explicitly determine the analysis types 260 required to validate the design. Rather, the user only needs to define the scenarios 240, 242 that indicate the desired effects of the product design, and a computer application automatically determines the implied analysis types 260 required to validate the product design.

FIG. 2C illustrates a method and/or software assembly 270 executed as a computer application for generating a sequence of simulations from the analysis types 260 determined in FIG. 2B. The method/assembly 270 begins with the defined scenarios 240, 245. At step or module 272, the method/assembly 270 progresses through each of the scenarios 240, 245, and, at step or module 274, the method/assembly 270 progresses through each of the operating environment conditions 220 in a given scenario. For each of the operating environment conditions 220, at step or module 276, the method 270 looks up (in memory) the associated analysis type 260, as determined in FIG. 2B, and, at step or module 278, adds that associated analysis type 260 to a list of analysis types.

The method/assembly 270 continues with the design targets 230. At step or module 284, the method/assembly 270 progresses through each of the design targets 230. For each of the design targets 230, at step or module 286, the method 270 looks up (in memory) the associated analysis type 260, as determined in FIG. 2B, and, at step or module 288, adds that associated analysis type 260 to a list of analysis types.

In some embodiments, method/assembly 270 may combine, or otherwise simplify, the analysis types in the list of analysis types prior to processing the list. For example, in FIG. 2B, each of the operating environment conditions imply an associated structural analysis type but do not imply a more specific kind of structural analysis. However, the design target factor of safety more specifically implies an associated structural static analysis. Thus, in some embodiments, the method/assembly 270 may combine the analysis types of structural and structural static to simplify the analysis type list to include only the more specific analysis type of structural static.

At step or module 280, the method/assembly 270 then transmits the complete list of analysis types to a simulator (black box). The black box was previously configured by a method developer or system with domain-specific knowledge of simulations. At step or module 290, the black box progresses through each of the analysis types in the list, and, at step or module 292 determines analysis methods and an analysis sequence of the analysis methods based on its domain-specific knowledge for validating the product design. Example 2, as follows, illustrates part of the black box configuration used to determine the analysis methods and analysis sequence in step or module 292.

EXAMPLE 2 if ( analysis set contains "structural static" + "structural durability" ) then
   sequence = structural static → structural durability
else if ( analysis set contains "structural static" + "structural frequency")
   then sequence = structural static preload step → structural frequency step end if In Example 2, simulation analysis methods are configured at the black box based on simulation analysis types. The function "analysis set contains" is passed the analysis types "structural static"+"structural durability" and "structural static"+"structural frequency". The function determines that the "structural static→structural durability" and "structural static preload step→structural frequency step" analysis methods are needed to validate the design of product 210. The function "sequential" is further passed the determined simulation analysis methods to further determine the sequence (placed in the "sequence" variable) of executing these determined simulation analysis methods. From Example 2, the black box returns the sequence of analysis methods (simulations) to run to validate the design of the product 210 as "Structural Static Analysis (Structural Static Step)→Durability Analysis" followed by "Structural Static Analysis (Structural Static Preload Step→Frequency Step)."

In this way, as the design target of factor of safety was specified for the product 210 in FIG. 2A, the method/assembly 270, via the black box, determines a structural static stress analysis method must be performed as a simulation. Further, as the design target of fatigue life was specified for the product 210 in FIG. 2A, the method/assembly 270, via the black box, determines that a structural static stress analysis method, with an additional post-processing method to obtain fatigue life results, must be performed as a simulation. Also, as the design target of vibration frequency was specified for the product 210 in FIG. 2A, the method/assembly 270 determines, via the black box, a frequency analysis method must be performed as a simulation, but because the scenario also includes force loads, then a static preloading step method must be carried out prior to a frequency extraction analysis method in the simulation.

At step or module 294, the returned analysis sequence from the black box is used by the computer application to generate and run simulations to produce validation data for the product design. The computer application analyzes the produced validation data against criteria, including the indicated design targets 230 and associated target values 232 of FIG. 2A, to provide an indication of validation (e.g., pass or fail) to the user. The computer application may also generate guidance (e.g., input values) for tuning, or otherwise improving, the design of the product 210. FIG. 2D illustrates example simulation results 236 for each scenario 240, 245 in terms of the design targets 230: factor of safety, fatigue life, and vibration frequency. Scenario 1 240 fails both the factor of safety design target (with simulated result 236 of 1.5, which is not in the target value 232 range of greater than 2.0) and fatigue life design target (with simulated result 236 of 8,900 cycles, which is not in the target value 232 range of greater than 20,000 cycles), and passes the vibration frequency design target (with simulated result 236 of 153 Hz, which is in the target value 232 range of greater than 100 Hz). Scenario 2 245 fails the vibration frequency design target (with simulated result 236 of 47 Hz, which is not in the target value 232 range of greater than 100 Hz), but passed both the factor of safety design target (with simulated result 236 of 3.2, which is in the target value 232 range of greater than 2.0) and fatigue life design target (with simulated result 236 of 22,600 cycles, which is in the target value 232 range of greater than 20,000 cycles). The simulation results 236 for each scenario 240, 245, as shown in FIG. 2D, may be provided to the user. The computer application may further automatically analyze these simulation results 236 against the target values 232 to provide an indication of failed validation to the user for both scenarios 240, 245. The computer application may also generate guidance (e.g., input values) for tuning, or otherwise improving, the design of the product 210 based on these simulation results 236.

Another Example of Generating Simulations for Validation

FIGS. 3A-3B illustrates another example of generating simulations for the validating of a product design in embodiments of the present invention. FIG. 3A, similar to FIG. 2A, illustrates the providing of input by a user (e.g., product designer) for the purpose of designing a product 210. The user provides the input by defining two scenarios 340, 345 likely experienced by the product 210 that indicate the desired effects of the product design. The user defines the scenarios 340, 345 in the product design terms of operating environment conditions 320, which indicate the desired effects of the design of the product 210. The operating environment conditions 320 in scenario 1 340 include: hand push top, clamp bottom, airflow around product, initial temperature, and heat radiation. The operating environment conditions 320 in scenario 2 345 include: hand push side, heat radiation, electrical heat source, and water flow around product. For all the operation environment conditions, except clamp bottom, the user also provides an associated value 322 that indicates the desired effect of the hand push top in the defined scenario (as shown in FIG. 3A).

Further, in FIG. 3A, similar to FIG. 2A, design targets 330 that the product must satisfy are also provided to further indicate the desired effects of the product design. The user indicates that the product design must satisfy the design targets fatigue life, vibration frequency, maximum temperature after 3 seconds (s), maximum "long-time" temperature, maximum air pressure drop, maximum turbulent kinetic energy, maximum stress, buckling load, and factor of safety to further indicate the desired effects of the product design. For each of these design targets, the user also provides a target value 332 indicating the certain bounds on the respective design target 320 that the design must satisfy for validation.

FIG. 3B, similar to FIG. 2B, illustrates the mapping (by a computer application) of the operating environment conditions 320 and design targets 330 of FIG. 3B to simulation analysis types 360 implied by these conditions/targets. The method and/or software assembly 270 of FIG. 2A can be used to process the analysis types 360 of FIG. 3B, in the same manner as described in reference to FIG. 2B, to generate a sequence of simulations. Example 3, as follows, illustrates part of the black box configuration used to determine the analysis methods and analysis sequence at step or module 292 based on the analysis types 360 of FIG. 3B.

EXAMPLE 3

```
if ( analysis set contains "Structural Static" + "Structural Durability") then
    sequence = Structural Static → Structural Durability
else if ( analysis set contains "Structural Static" + "Structural Frequency")
    then sequence = Structural Static Preload Step → Structural
    Frequency Step
else if ( analysis set contains "Structural Static" + "Buckling") then
    sequence = Structural Static Preload Step → Buckling Step
else if ( analysis set contains "Structural Static: + "Steady State Heat
    Transfer") then sequence = Steady State Heat Transfer
    Analysis → Structural Static Analysis
else if ( analysis set contains "Structural Static" + "Transient Heat
    Transfer") then sequence = Transient Heat Transfer
    Analysis → Structural Static Analysis
else if ( analysis set contains "Structural Static" + "CFD" then
    sequence = CFD Analysis → Structural Static Analysis
else if ( analysis set contains "CFD" + "Heat Transfer" then
    sequence = CFD Analysis → Heat Transfer Analysis
end if
```

The black box configuration of Example 3 is structured in the same manner as described for Example 2, but includes different analysis types and methods. From Example 3, the black box returns the sequence of analysis methods to run to validate the design of the product 210 as "CFD Analysis-→Transient Heat Transfer Analysis→Structural Static Analysis (Static Preload Step→Frequency Step→Buckling Step)→Durability Analysis." The returned analysis sequence may then be used by the computer application to generate and run simulations to produce validation data for the product design. The computer application analyzes the produced validation data against criteria, including the indicated design targets 330 and associated target values 332 of FIG. 3A, to provide an indication of validation (e.g., pass or fail) to the user.

Digital Processing Environment

Figure 4:
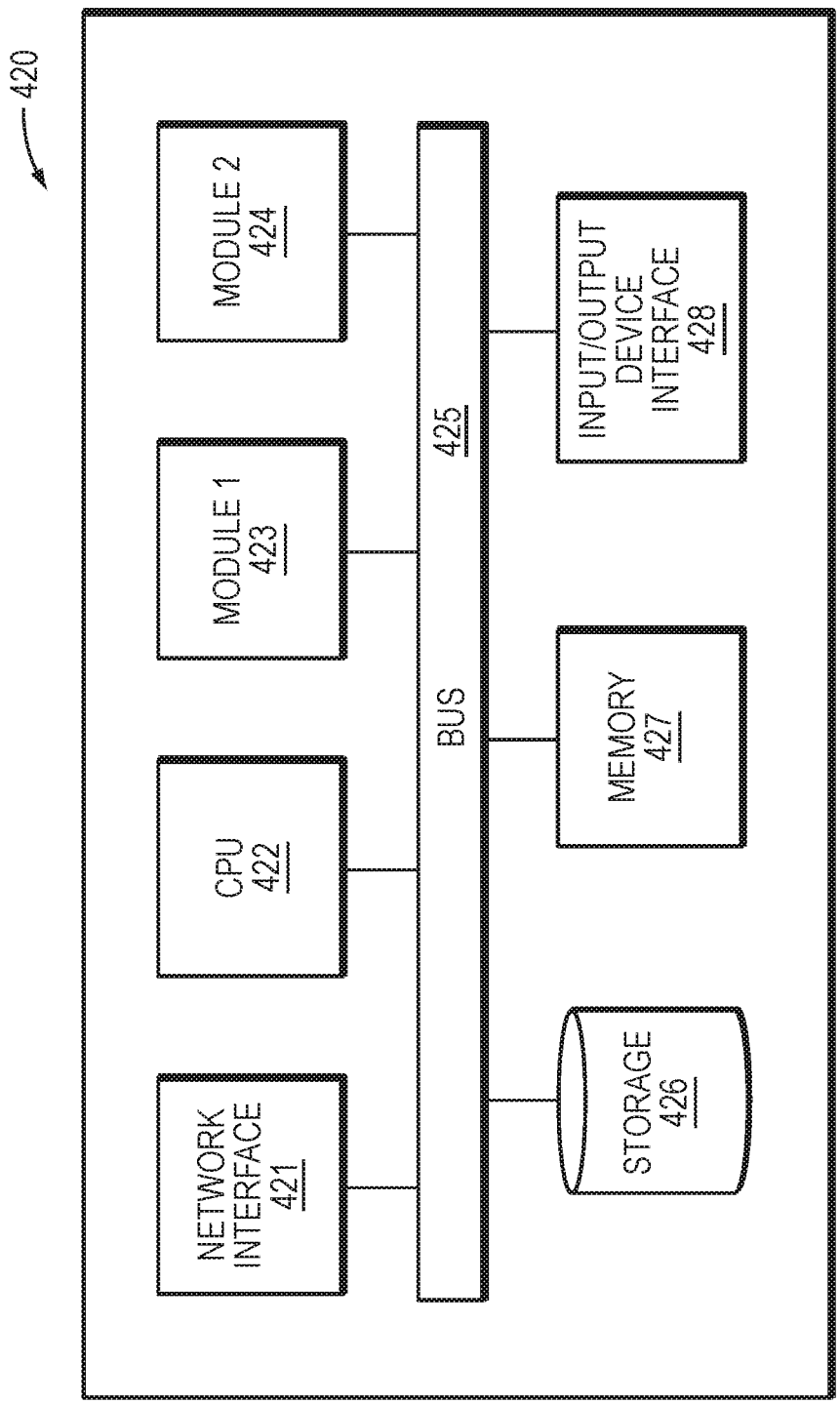
FIG. 4 is a block diagram of a computer (or digital processing) system for inverting a simulation process in at least one embodiment of the present invention.

FIG. 4 is a simplified block diagram of an example computer-based system 420 that may be used to invert a simulation process according to an embodiment of the present invention. The system 420 comprises a bus 425. The bus 425 serves as an interconnector between the various components of the system 420. Connected to the bus 425 is an input/output device interface 428 for connecting various input and output devices such as a keyboard, mouse, display, speakers, etc. to the system 420. Input/output device interface 428 may connect a display to the system 420 to enable a user to define product design scenarios (provide operating environment conditions) and provide design targets as shown in FIGS. 2B and 3B. A central processing unit (CPU) 422 is connected to the bus 425 and provides for the execution of computer instructions. Memory 427 provides volatile storage for data used for carrying out computer instructions. Storage 426 provides non-volatile storage for software instructions, such as an operating system (not shown). In particular, memory 427 and/or storage 426 may be configured with program instructions implementing methods 100 and 270 for executing an inverted simulation process detailed above in FIGS. 1 and 2C. The program instructions may include the code of the configured simulator (black box) shown in Examples 1-3. The system 420 also comprises a network interface 421 for connecting to any variety of networks known in the art, including cloud, wide area networks (WANs) and local area networks (LANs).

Further connected to the bus 425 is a first module 423. The first module 423 is configured to enable a user to define operating environmental conditions and design targets for the purpose of product design. The first module 423 may provide loading and display functions through any means known in the art to enable the user to define these conditions/target and to automatically map the conditions/targets to simulation analysis types. For example, the first module 423 may reference operating environment conditions, design targets, and simulation analysis types that are stored on the storage device 426 or memory 427. For further example, the first module 423 may load the operating environment conditions, design targets, and simulation analysis types from any point communicatively coupled to the system 420 via the network interface 421 and/or input/output device interface 428.

The system 420 further comprises a second module 424 that is communicatively/operatively coupled to the first module 423. The second module (simulator module) 424 is configured to automatically determine simulations from the simulation analysis types mapped to the conditions/targets at the first module 423. The second module 424 may provide analysis methods and sequences through any means known in the art. For example, the second module 424 may store the analysis methods and sequences at the storage device 426 or memory 427. For another example, the second module 424 may generated a simulation including the analysis methods and sequences at the CPU 422 via the bus 425. For further example, the second module 424 may transmit the generated simulations to any point communicatively coupled to the system 420 via the network interface 421 and/or input/output device interface 428 to be executed to produce validation data for analysis.

It should be understood that the example embodiments described herein may be implemented in many different ways. In some instances, the various methods, systems, and devices described herein (FIGS. 1, 2A-2C, and 3A-3B) may each be implemented by a physical, virtual, or hybrid general purpose computer, such as the computer system 420. The computer system 420 may be transformed into the machines that execute the methods described herein, for example, by loading software instructions into either memory 427 or non-volatile storage 426 for execution by the CPU 422. Further, while the first module 423 and second module 424 are shown as separate modules, in an example embodiment these modules may be implemented using a variety of configurations.

The system 420 and its various components may be configured to carry out any embodiments of the present invention described herein. For example, the system 420 may be configured to carry out the methods 100 and 270 described hereinabove in relation to FIGS. 1 and 2C. In an example embodiment, the first module 423 and second module 424 may be implemented in software that is stored on the memory 427 and/or storage device 426. In such an example embodiment, the CPU 422 and the memory 427 with computer code instructions (including Examples 1-3) stored on the memory 427 and/or storage device 426 implement a first module that enable a user to define operating environmental conditions and design targets for the purpose of product design. Further, the components of the system 420 implement a second module that is operatively coupled to the first module and configured to determine simulations from the provided operating environment conditions and design targets.

Figure 5:
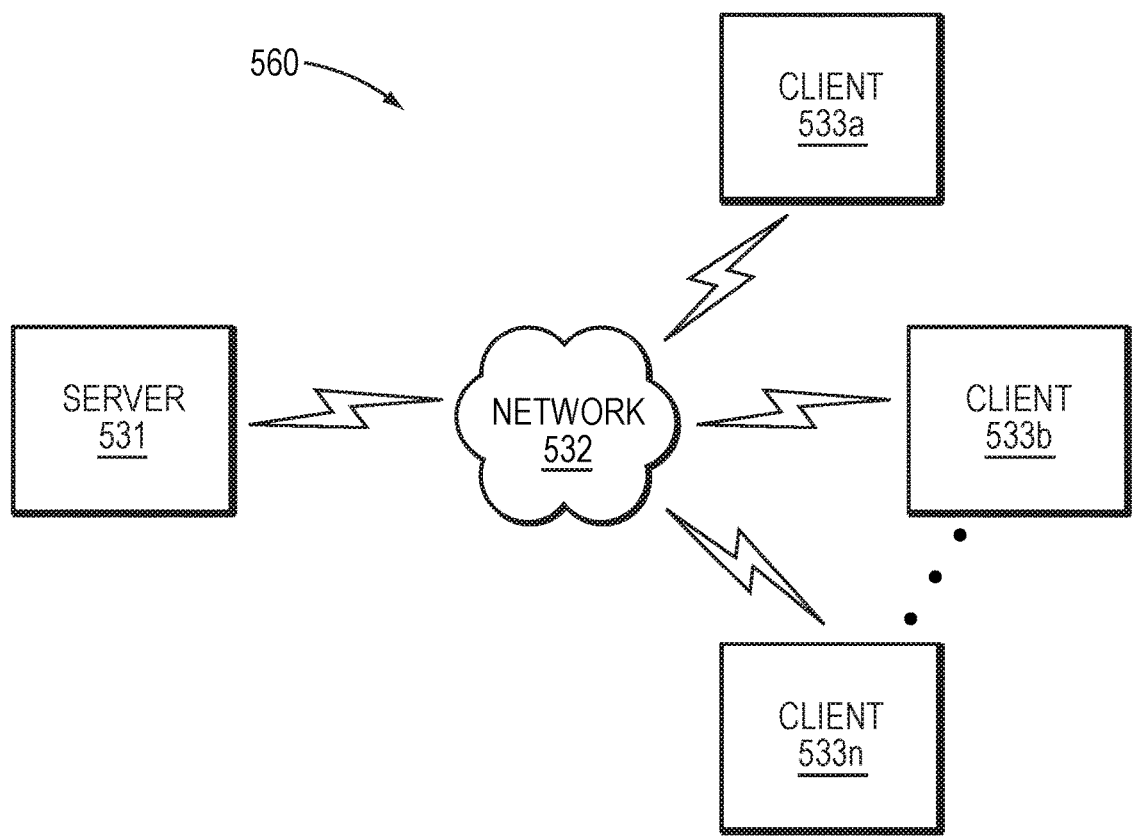
FIG. 5 is a schematic diagram of an example computer network environment in which embodiments of the present invention may be implemented.

FIG. 5 illustrates a computer network environment 560 in which an embodiment of the present invention may be implemented. In the computer network environment 560, the server 531 is linked through the communications network 532 to the clients 533*a-n*. The environment 560 may be used to allow the clients 533*a-n*, alone or in combination with server 531, to execute any of the methods described hereinabove (e.g., methods 100 and 270 of FIGS. 1 and 2C). It should be understood that the example embodiments described above may be implemented in many different ways. In some instances, the various methods and machines described herein may each be implemented by a physical, virtual, or hybrid general purpose computer, or a computer network environment such as the computer environment 560.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of inverting a simulation process, the method comprising:
    configuring a simulator with one or more simulation analysis methods configured for selection by the simulator to at least one simulation based on simulation analysis types;
    providing, to the simulator, at least one of product design, design targets for the product, and operating environment conditions for the product;
    automatically defining, by the simulator, at least one simulation for validating the product design by selecting one or more of the simulation analysis methods based on the product design parameters;
    mapping each of a set of design targets for the product to an analysis type that is added to a list of analysis types associated with the product;
    simplifying the list of analysis types by combining at least some of the analysis types in the list of analysis types;
    generating the at least one simulation by determining an analysis sequence from the simplified list of analysis types;

executing the at least one defined simulation;
receiving product design input that indicates design targets for assessing the product design;
automatically analyzing, by the simulator, the resulting simulation data, using the received design targets, to validate the product design;
determining simulation input values for tuning or improving the validated product design; and
outputting the determined simulation input values to a user.

2. The method of claim 1, the automatically defining further comprises:
mapping each of the product design parameters to one or more analysis types; and
determining, via the simulator, a sequence of the one or more simulation analysis methods to execute.

3. The method of claim 2, wherein the analysis methods include analysis sequences defined based on the one or more analysis types.

4. The method of claim 2, wherein the one or more analysis types include at least one of: structural, structural static, structural durability, structural buckling, heat transfer, transient heat transfer, steady-state heat transfer, computational fluid dynamics (CFD), CFD external flow, and frequency.

5. The method of claim 1, wherein the product design parameters include at least one of operating environment conditions and design targets for the product design.

6. The method of claim 1, wherein the analysis methods are configured at the simulator by one or more method developers.

7. A computer system for inverting a simulation process, the system comprising:
an interconnecting bus;
a processor communicatively coupled to said interconnecting bus; and
a memory with computer code instructions stored thereon, the memory operatively coupled to the processor such that, when executed by the processor, the computer code instructions cause the computer system to implement:
a first module communicatively coupled to said interconnecting bus and configured to:
receive one or more user-defined operating environmental conditions and design targets associated with a product design; and
map a plurality of simulation analysis types to the user-defined operating environmental conditions and design targets;
add each analysis type to a list of analysis types associated with the product;
map each of the design targets to an analysis type added to the list of analysis types associated with the product; and
simplify the list of analysis types by combining at least some of the analysis types in the list of analysis types;
a simulator module configured to automatically determine simulations from the plurality of simulation analysis types mapped to the one or more user-defined operating environmental conditions and design targets at the first module with one or more simulation analysis methods;
a user interface configured to enable providing product design parameters to the simulator module; and
a computer application operatively coupled to the simulator module, the computer application configured to:
automatically define at least one simulation for validating the product design by selecting one or more of the simulation analysis methods based on the product design parameters;
determine an order of execution of the selected one or more simulation analysis methods;
execute the selected one or more simulation analysis methods of the at least one defined simulation in the determined order to validate the product design;
automatically analyze, by the simulator, the resulting simulation data, using the received design targets, to validate the product design;
determine simulation input values for tuning or improving the product design; and
output the determined simulation input values to a user through the user interface.

8. The system of claim 7, wherein the application is further configured to:
map each of the product design parameters to one or more analysis types; and
determine, via the simulator, a sequence of the one or more simulation analysis methods to execute.

9. The system of claim 8, wherein the analysis methods include analysis sequences defined based on the one or more analysis types.

10. The system of claim 8, wherein the one or more analysis types include at least one of: structural, structural static, structural durability, structural buckling, heat transfer, transient heat transfer, steady-state heat transfer, computational fluid dynamics (CFD), CFD external flow, and frequency.

11. The system of claim 7, wherein the product design parameters include at least one of: operating environment conditions and design targets for the product design.

12. The system of claim 7, wherein the analysis methods are configured at the simulator by one or more method developers.

13. A computer-implemented method of inverting a simulation process to validate a product design, the method comprising:
designing a product by defining scenarios likely experienced by the product and a set of design targets, wherein each defined scenario includes a set of operating environment conditions;
for each defined scenario:
mapping each of the set of operating environment conditions to an analysis type;
adding the analysis type to a list of analysis types associated with the product;
mapping each of the set of design targets to an analysis type that is added to the list of analysis types associated with the product;
simplifying the list of analysis types by combining at least some of the analysis types in the list of analysis types;
generating one or more simulations by determining an analysis sequence from the simplified list of analysis types;
executing the one or more simulations based on the determined analysis sequence to validate the product design;
receive product design input that indicates design targets for assessing the product design;

automatically analyze, by the simulator, the resulting simulation data, using the received design targets, to validate the product design;

determine simulation input values for tuning or improving the product design; and output the determined simulation input values to a user.

14. The method of claim 13, wherein the analysis sequence is determined by a simulator module configured by one or more method developers.

15. The method of claim 13, wherein the analysis types include one or more of: structural, structural static, structural durability, structural buckling, heat transfer, transient heat transfer, steady-state heat transfer, computational fluid dynamics (CFD), CFD external flow, and frequency.

16. The method of claim 13, wherein the operating environment conditions include at least one of: loads, restraints, temperatures, and fluid velocities.

17. The method of claim 13, wherein the design targets include at least one of: minimum factor of safety, maximum displacement, fatigue life, minimum lowest frequency, other industry specifications, and other industry standards.

18. The method of claim 13, wherein each operating environment conditions and each design target is mapped to at least one analysis type in computer memory.

19. A computer system for inverting a simulation process to validate a product design, the system comprising:

a user interface configured to define scenarios likely experienced by a product and a set of design targets, for the purpose of designing the product, each defined scenario including a set of operating environment conditions;

at least one processor; and a memory with computer code instructions stored thereon, the memory operatively coupled to the at least one processor such that, when executed by the at least one processor, the computer code instructions cause the computer system to:

for each scenario:

map each of the set of operating environment conditions of each scenario to an analysis type;

add the analysis type to a list of analysis types associated with the product;

map each of the set of design targets to an analysis type;

add the analysis type to the list of analysis types associated with the product;

simplify the list of analysis types by combining at least some of the analysis types in the list of analysis types;

determining an analysis sequence from the simplified list of analysis types;

generate one or more simulations using the determined analysis sequence;

execute the one or more simulations based on the determined analysis sequence to validate the product design;

receive product design input that indicates design targets for assessing the product design;

automatically analyze, by the simulator, the resulting simulation data, using the received design targets, to validate the product design;

determine simulation input values for tuning or improving the product design; and output the determined simulation input values to a user.

20. The system of claim 19, wherein the analysis sequence is determined by a simulator module configured by one or more method developers and operatively coupled to the at least one processor.

21. The system of claim 19, wherein the analysis types include one or more of: structural, structural static, structural durability, structural buckling, heat transfer, transient heat transfer, steady-state heat transfer, computational fluid dynamics (CFD), CFD external flow, and frequency.

22. The system of claim 19, wherein the operating environment conditions include at least one of: loads, restraints, temperatures, and fluid velocities.

23. The system of claim 19, wherein the design targets include at least one of: minimum factor of safety, maximum displacement, fatigue life, minimum lowest frequency, other industry specifications, and other industry standards.

24. The system of claim 19, wherein each operating environment conditions and each design target is mapped to at least one analysis type in computer memory.

* * * * *